United States Patent
Lamb et al.

[11] Patent Number: 6,111,749
[45] Date of Patent: *Aug. 29, 2000

[54] FLEXIBLE COLD PLATE HAVING A ONE-PIECE COOLANT CONDUIT AND METHOD EMPLOYING SAME

[75] Inventors: Charles Robert Lamb, Endwell; Kang-Wah Li, Flushing, both of N.Y.; Elias Papanicolaou, Karlsruhe, Germany; Charles Chaolee Tai, Vestal, N.Y.

[73] Assignee: International Business Machines Corporation, Armonk, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 08/719,938

[22] Filed: Sep. 25, 1996

(Under 37 CFR 1.47)

[51] Int. Cl.$^7$ ................................................. H05K 7/20
[52] U.S. Cl. ........................... 361/699; 361/687; 361/692; 361/704; 361/752; 257/715; 165/104.33; 165/185; 174/16.3
[58] Field of Search ..................... 361/687, 699, 361/700–710, 717–721, 752, 734, 754; 165/80.2, 80.3, 80.4, 104.32, 104.33, 168, 46, 76, 165, 185; 62/3.7, 259.2, 3.5; 257/707–726; 343/720; 439/194

[56] References Cited

U.S. PATENT DOCUMENTS

| | | | |
|---|---|---|---|
| 3,823,771 | 7/1974 | Ludwig | 165/80 |
| 3,917,370 | 11/1975 | Thornton et al. | 339/16 R |
| 4,366,497 | 12/1982 | Block et al. | 357/82 |
| 4,583,583 | 4/1986 | Wittel | 165/46 |
| 4,747,450 | 5/1988 | Ikegame et al. | . |
| 4,977,444 | 12/1990 | Nakajima et al. | 357/82 |
| 5,036,384 | 7/1991 | Umezava | 357/82 |
| 5,125,451 | 6/1992 | Matthews | . |
| 5,144,531 | 9/1992 | Go | 361/382 |
| 5,150,274 | 9/1992 | Okada et al. | 361/382 |
| 5,280,409 | 1/1994 | Selna et al. | . |
| 5,329,419 | 7/1994 | Umezawa | . |

FOREIGN PATENT DOCUMENTS

| | | | |
|---|---|---|---|
| 002590005A | 5/1987 | France | H05K 7/20 |
| 362108560A | 5/1987 | Japan | H01L 23/46 |
| 405304381A | 11/1993 | Japan | H05K 7/20 |
| 000677293A | 4/1991 | Switzerland | H01L 23/473 |

OTHER PUBLICATIONS

Landrock et al., "Cooling System for Semiconductor Chips," IBM Technical Disclosure Bulletin, vol. 23, No. 4, Sep. 1980, p. 1483.

Hodgson et al., "Cold Plate Vacuum Chuck for Cooling Printed Circuit Boards," Research Disclosure, No. 31491, (YO888–0769), Jun. 1990.

EG&G Wakefield Engineering Publication, Liquid Cooled Plates for Power Modules, Transistors and Diodes, Series 180–12, 180–20 and 180–26.

*Primary Examiner*—Leo P. Picard
*Assistant Examiner*—Michael Datskovsky
*Attorney, Agent, or Firm*—Lily Neff, Esq.; Heslin & Rothenberg, P.C.

[57] ABSTRACT

A method and apparatus for cooling electronic devices is suggested comprising of a thermally conductive, flexible, non-jointed cooling conduit able to house a coolant. The conduit is passed or pulled through apertures provided on two or more cold plates. The conduit and plates are then placed in thermal communication with the electronic device or assembly to be cooled. The flexibility of the conduit allows the conduit with plates to be rearranged as to conform to the contours of the device to be cooled.

50 Claims, 2 Drawing Sheets

FLEXIBLE COLD PLATE HAVING A ONE-PIECE COOLANT CONDUIT AND METHOD EMPLOYING SAME

FIELD OF THE INVENTION

This invention relates to an apparatus and method designed for regulating high interfacial thermal resistance problems in an electronic assembly, and in particular through the use of water as a coolant.

BACKGROUND OF THE INVENTION

The complex design of integrated circuits today contribute to the increased circuit density of the chips utilized. However, as the chip density increases, the thermal properties of the circuit package becomes an important concern. The ability to remove heat generated from the high-powered and highly dense integrated circuits in a semi-conductor packaging becomes vital to the function and performance of the electronics. The initial approach taken to cooling electrical devices through the use of air convection has been replaced by water cooling methods. As the density and integration level of these circuits increases, the amount of heat dissipated by the system can no longer be adequately removed through the use of conventional air convection techniques. Furthermore, the physical size of an effective air convection heat sink is prohibitive, a main concern when using compact devices such as lap-top computers.

Indirect water cooling approach using cold plates quickly has become a selected approach to eliminate the large amount of heat generated by the high power semiconductor modules on large size PC boards or cards. Nonetheless, indirect water cooling approach has not eliminated all heat removal concerns, particularly when a direct or immersion cooling approach is used.

The geometry of the circuit board and its modules have contributed to new concerns, compounding the heat removal problems. Often an array of electronic modules are mounted on a flat printed circuit board. The modules may be of different shapes and geometry and therefore, the height of a particular module can be much higher or lower than that of its neighbors. Due to a large variance of card flatness and module heights, a misalignment of module top surfaces can lead to a complicated set of problems affecting module powers, uneven thermal resistance and even solder failures caused by mechanical stress applied to the joints.

SUMMARY OF THE INVENTION

Accordingly, an object of the present invention is to provide an apparatus and method for cooling electronic devices able to accommodate a variety of geometric constraints.

Another object of the present invention is to provide an apparatus for uniform cooling of electronic devices able to accommodate the cooling of all components or modules regardless of location, while taking into account the misalignment of chip surfaces.

Yet another object of the present invention is to provide an apparatus and method for cooling electronic devices with an improved thermal performance and reliability feature.

A further object of the present invention is to provide a low cost alternative to electronic cooling devices.

To achieve the above-mentioned objects, and other related ones, a method and apparatus for cooling electronic devices is suggested comprising a thermally conductive, flexible, non-jointed cooling conduit able to house a coolant. The conduit is passed or pulled through holes provided on a plurality of cold plates. The conduit and plate arrangement is then placed in thermal communication with the electronic device or assembly to be cooled. The flexibility of the conduit allows the conduit with plates to be rearranged in X-Y or Z axis orientation as to complement the contour of the device to be cooled. This rearranging of the conduit provides for thermal conductivity improvements between the device and the conduit with plates.

In one embodiment of the present invention, the electronic device to be cooled is an electronic assembly housing modules. The cold plates are further individually secured to the modules to provide maximum cooling.

BRIEF DESCRIPTION OF THE DRAWINGS

The subject matter which is regarded as the invention is particularly pointed out and distinctly claimed in the concluding portion of the specification. The invention, however, both as to organization and method of practice, together with the further objects and advantages thereof, may best be understood by reference to the following description taken in conjunction with the accompanying drawings in which:

DETAILED DESCRIPTION OF THE INVENTION

Figure 1:
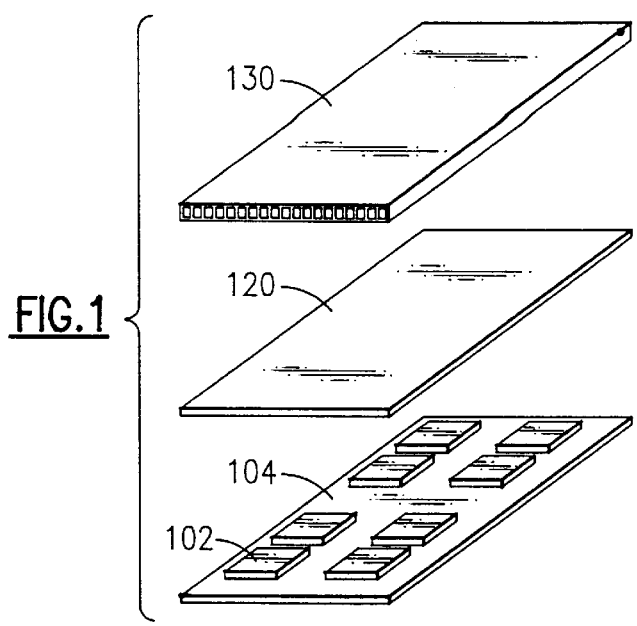
FIG. 1 is a typical cold-plate cooling system design such as the one used in prior art.

FIG. 1 shows a typical cold-plate cooling system design such as the one used in the prior art. In this traditional design or other similar indirect water cooling systems, the approach taken is to cool all semiconductor modules, as shown at 102, on a board or card, as shown at 104, using a one-piece rigid common cold plate, as shown at 130, to exchange heat with modules through conduction. However, the variation in module height differences and geometry as well as card warpage, causes a misalignment of the module surfaces interfering with the cold plate making a good contact with all the modules.

The misalignment of module top surfaces can be quite significant, due to variance of card flatness and module heights. Several experiments were conducted showing that a sample 8×12 inch memory card had a maximum warpage of 42 mils before card assembly and wave solder. In another study an estimated maximum module top surface misalignment of +/−14 mils was calculated. These would result in a maximum module top surface misalignment of +/−56 mils.

To provide good contact between the cold plate and the modules, a compressible interface material, as shown at 120, had been used to fill up the gaps in an effort to form a good conduction heat path. However, in instances when the misalignment is significant, (such as in the above-mentioned example) the interface material needed had to be very compressible and thick, often thicker than 100 mils. This compressibility and thickness requirement often limits the choice of interface material to be used to elastomers in sponge form which unfortunately only provide moderate thermal conductivity. Furon Silicon Rubber Sponge is such a material with a mere 0.5 watt/(deg K-meter) at 5 psi and 2.7 w/K-m even with a pressure of under 34 psi and only at a 50% compression capacity. The thermal resistance of an 1 inch square and $\frac{1}{16}$ inch thick Furon R-10404 foam was measured at 10 deg C/w and 5 psig pressure. For a 32 mm SBC (Single Board Computer) dissipating 17.5 watts, this would result in an 110 deg C temperature rise across the interface alone. Yet, to meet the compression requirement of a +/−56 mil surface misalignment, such as the one stated in the example earlier, a much thicker interface material will be needed, resulting in an even higher interface thermal resistance and/or temperature rise. Furthermore, in order to force the SBC top surfaces to make contact with the cold-plate at a needed 34 psi pressure, a large mechanical force must be applied to the printed card. As a result, the solder joints of modules on the card will be highly stressed which would largely increase the probability of future solder failures.

Figure 2:
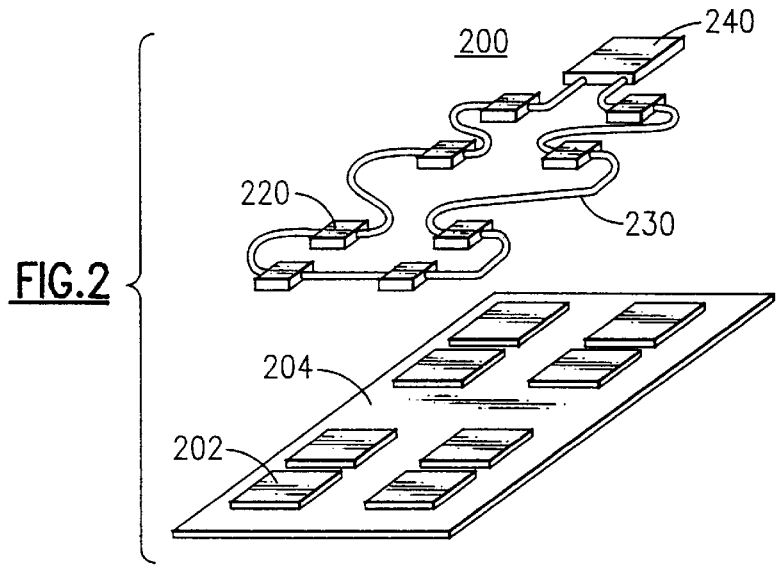
FIG. 2 is an illustration of one embodiment of the present invention.
Figure 3:
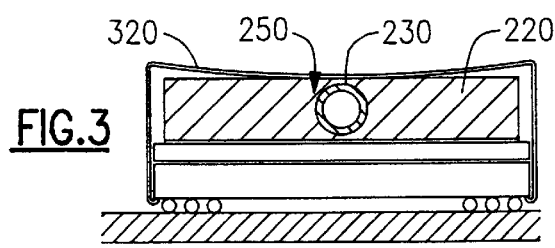
FIG. 3 is an illustration of a clamping mechanism such as the one used in one embodiment of the present invention.

The problems associated with prior art are resolved in the present disclosure. FIG. 2 is an illustration of one embodiment of the present invention. As shown in FIG. 2, a flexible, monolithic, non-jointed coolant conduit is provided as shown at 230. A plurality of cold plates, as shown at 220, are connected to this conduit. The plates can be used specifically to provide concentrated cooling in selective areas, such as in component areas of the device, while the conduit will provide more uniform cooling to the device as a whole. For example, when the electronic device is an electronic assembly that houses a plurality of modules, the plates can be directly placed on the modules, and even further secured to provide the desired cooling effect to those areas. One embodiment of the present invention as shown in FIG. 3, provides for a clamping mechanism used for securing the plates to the modules for such improved cooling. A spring clamps as shown at 320 is provided in this particular embodiment.

Figure 6:
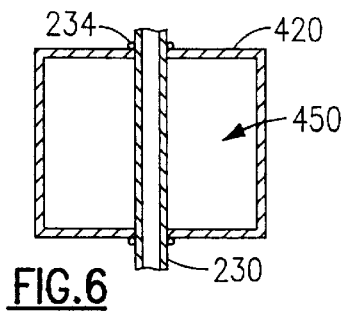
FIG. 6 is an illustration of an alternative embodiment of a cold plate.
Figure 7:
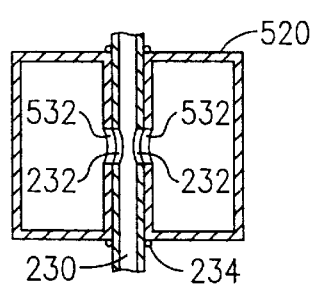
FIG. 7 is another illustration of an alternative embodiment of a cold plate.

The flexible conduit is able to house a coolant, independently or by being connected to a coolant supply. In either case, the conduit can serve as a coolant supply to the plates and as a cooling element for the electronic device. In some circumstances, depending on the overall cooling effect desired and the thermal conductivity of the plate material used, it may sufficient to cool the plates just by placing them in contact with the cooled conduit. In other circumstances, however, where a greater overall cooling effect is desired, a plate 420 (FIG. 6) can be designed as to have an internal chamber 450 (FIG. 6), or alternatively, plate 220 (FIG. 3) can be designed to have a hollow center portion 250 as to house a coolant. The coolant can be supplied to the plates either independently or via the conduit. When the coolant is provided independently, the coolant is usually provided in the plates and then the plates are sealed as to provide a closed and leakage proof environment. When the coolant is to be provided via the conduit, in one embodiment as shown in FIG. 7, corresponding apertures 532 and 232 are provided in the plate-chamber arrangement as well as in the conduit so that when these apertures are lined up, the coolant flows freely from the conduit into the plate-chamber (and vice versa if needed). The conduit and plates arrangement is then sealed around the area of these apertures as to guard against coolant leakage.

In a preferred embodiment of the present invention, the cold plates are made of copper and the conduit is either copper or aluminum. The coolant of choice is water and the conduit itself has a serpentine pattern. The serpentine feature of the design also provides thermal stress relief.

The shape of the cold plates and the method of attaching them to the conduit can be varied. In one embodiment of the present invention, each plate is provided a hole selectively located and used for passing or pulling of the conduit through it. The holes have to be sized, however, as not to constrict the flow of coolant once the conduit is passed or pulled through them. In a preferred embodiment of this design, the rigid one piece large common cold plate of the original design is replaced by eight small cooling blocks. In this embodiment each of these blocks are clipped on the top surfaces of the modules independently with a spring clip again as shown in FIG. 3. The cooling blocks are then connected with a $\frac{3}{16}$ inch O.D. soft copper tube.

In an alternate embodiment, an indentation like opening, in some embodiments resembling a slit, is provided along a peripheral edge of each plate to allow the plates to slip around the conduit. Again, the openings have to be sized so as not to constrict coolant flow. In a preferred embodiment of this design, the indentation like openings are U shaped channels provided in top of the plates in order to lay the conduit in them.

In either design, solder or securing means 234 (FIGS. 6 and 7) or alternate attachment methods can then be used to fix the conduit more securely to the plates, before or after putting the plate-conduit arrangement in thermal communication with the device and the components to be cooled.

In one embodiment of the present invention, it is possible to secure the two ends of the conduit to one another. In an variation of this embodiment, the conduit is twisted into a serpentine design before the ends are secured to one another. In either case it is obviously that if the plate designs are such that the conduit has to be pulled through the plates, the securing of the conduit ends has to be accomplished after the conduit is pulled through the plates holes. However, when in the alternate design where the plates can be slipped around the conduit, the conduit ends can be secured at any time either before or after the plates are slipped around the conduit. In this latter instance it is even possible for the conduit ends to be secured once the conduit has been already put in thermal contact with the device to be cooled, so as to provide more conformity with the contour requirements of the device.

Figure 9:
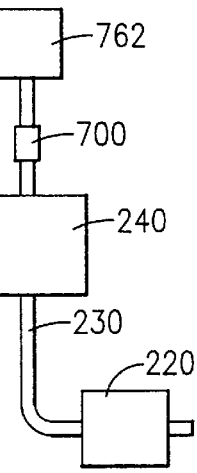
FIG. 9 is an illustration of an alternative attachment of a coolant supply.
Figure 8:
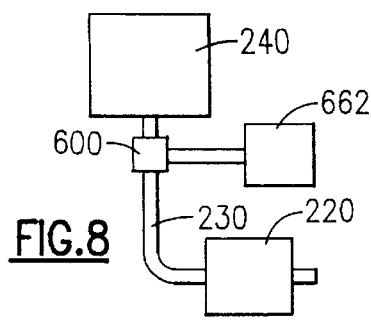
FIG. 8 is an illustration of an attachment of a coolant supply.

If the ends of the conduit are to be secured to one another, however, means has to be provided for coolant placement in the conduit. For example, it may be possible to provide a coolant prior to securing the ends. In this case the ends are also sealed as to prohibit fluid leakage so that a closed environment is formed inside the conduit housing the coolant. In the alternative if an auxiliary coolant supply source 662 is being used as shown in FIG. 8, a valve or similar such devices can be used for connecting the conduit to the supply source. The valve would also regulate coolant flow, the amount of coolant provided and control coolant ingress/egress. In yet another alternative embodiment, the ends can be secured to one another via a connector. It is important that the connector be of such size and configuration as not to constrict the flow of the coolants. The connector can either provide a closed internal coolant environment, or be used in conjunction with a valve 700 (FIG. 9). It is also possible for the connector to act independently as a coolant regulator, providing both access to an auxiliary coolant supply source 762 (FIG. 9) and also controlling the flow and ingress/egress of the coolant into (and out of) the conduit if a valve is not provided. A connector is shown in FIG. 2 at 240.

One of the advantages of the flexible cold-plate design of the present invention is its ability to conform to the contour requirements of any electronic device, such as the electronic assembly and modules of FIG. 2. The design of flexible cold-plate arrangement of FIG. 2 is completely complimentary and conformal to the modules top surfaces shown at 202. The flexibility of the conduit will allow a 3-dimensional freedom of movement of plates and the conduit X-Y plane which will make the cooling self-adjustable to the X-Y locations of the modules or other components. In this way the conduit and cold plates can adjust their height to match the misalignment of each individual modules or component. Due to this 3-dimensional flexibility, no precision of X-Y-Z dimensional location is needed. Furthermore, with this freedom of movement and a positive securing mechanism such as the clamping mechanism of FIG. 3, the cold plates are pressed tightly onto the top surfaces of each module. Hence the requirement of a thick flexible interface material and its relatively high thermal resistance is eliminated.

Test data showed that even without any interfacial material (i.e. dry contact), such as the clipped-on contact mechanism of FIG. 3, the result would yield a low interfacial thermal resistance of 0.5 deg C/W nominal and 1.0 deg C/W in worst case. In a preferred embodiment of the present invention, an interfacial thermal layer is also provided between the component, i.e. module, to be cooled and the cold plates. This interface layer will further enhance the cooling abilities of the conduit-plate arrangement without any adverse effects. For example when the interface applied is a 2 mil thick of thermal grease, the interfacial thermal resistance will be reduced to a negligible 0.045 deg C/W. Hence, the present flexible cold-plate design not only would result to a 153 deg C chip temperature reduction at worst case and 82 deg C at nominal case but also would relax the severe mechanical stress on the solder joints as it would be resulted by a rigid cold-plate design.

Figure 4:
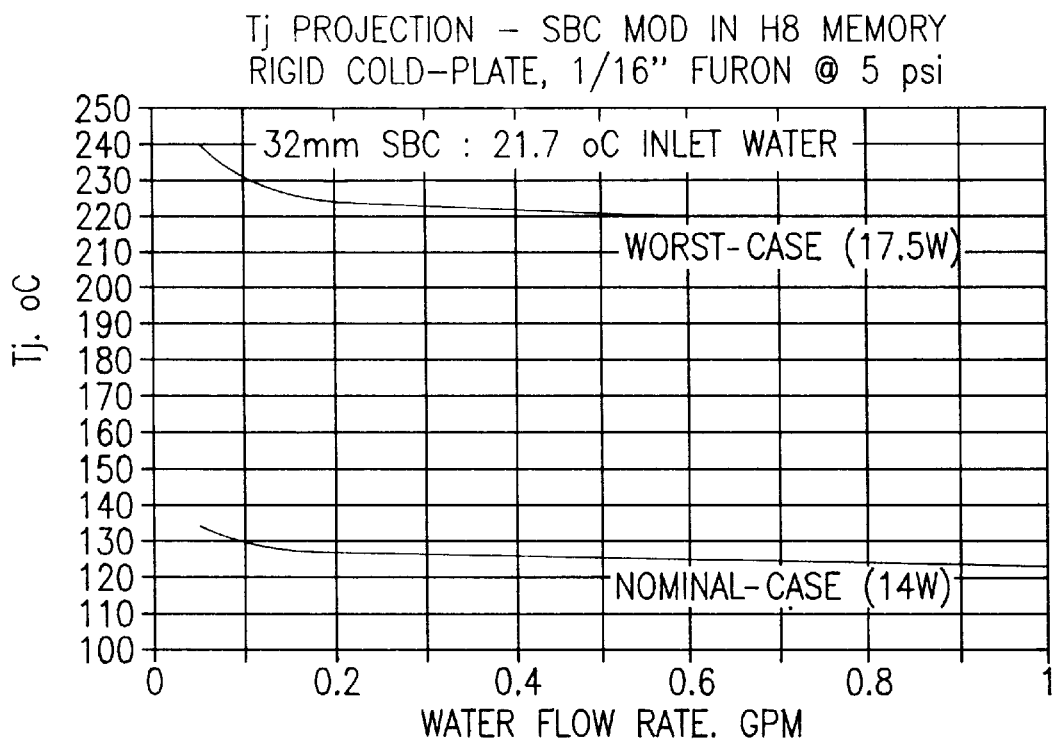
FIGS. 4 and 5 show the calculated worst-case chip temperatures for both the conventional rigid cold plate design and the flexible cold plate design respectively.
Figure 5:
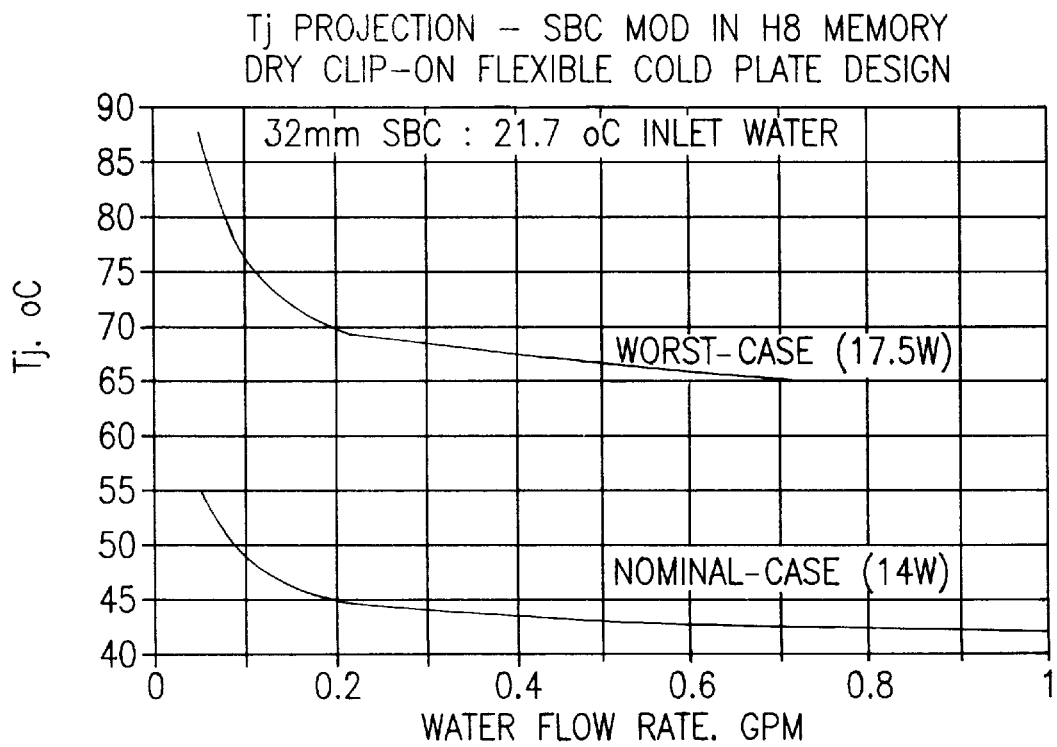

To demonstrate the thermal advantages of the present design the empirical interfacial thermal resistance data and convection thermal resistance data is used to calculate the Tj's of modules on a certain memory card. FIGS. 4 and 5 show this same comparison data on a graph for the calculated worst-case chip temperatures of the same memory card for both the conventional rigid cold plate design and the flexible cold plate design respectively. The following graph is a brief comparison of the calculated thermal resistance and Tj at worst-case situation based on these verified data for 0.25 gpm water flow rate.

| INTERFACE MATERIAL | RIGID COLD-PLATE .0625" Furon R10404 | FLEX. COLD-PLATE Dry | Th. Grease |
|---|---|---|---|
| WC Water Temp (C.) | 25.4 | 25.4 | 25.4 |
| Chip Power (watts) | 17.4 | 17.4 | 17.4 |
| Rint (given - C/W) | 1.18 | 1.18 | 1.18 |
| Water-to-Cold Plate Resistance | 0.03 | 0.09 | 0.09 |
| Cold Plate to SBC Interface resistance *1 | 9.9 | 1.0 | 0.07 |
| Resulting Chip TJ | 222 deg C. | 69 | 51 |

Note *1 - Worst than normal values are used due to variations in contact surface condition and pressure.

In addition to thermal advantages, the 3-dimensional freedom of movement of each individual cold plate provides substantial advantage in cost reduction because no precision positioning nor machining is needed in the manufacture of the flexible cold plate design of the present invention. Furthermore, due to a simplified design the reliability of the cooling system would also be improved.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. An apparatus for cooling an electronic device having a three-dimensionally contoured surface to be cooled, the apparatus comprising:
    a plurality of thermally conductive cold plates each having at least one hole extending through said plate;
    a one-piece thermally conductive cooling conduit thermally coupled to said cold plates and extending through said at least one hole in each of said plurality of cold plates; and
    said cooling conduit being bendable to three-dimensionally orient said cold plates to correspond and be placed in thermal communication with the three-dimensionally contoured surface of the electronic device to be cooled.

2. The apparatus of claim 1, wherein said cold plates comprise a chamber for housing a coolant.

3. The apparatus of claim 2, further comprising at least one aperture provided in each plate chamber and corresponding apertures provided in said cooling conduit so that when said conduit apertures are lined up with said plate chamber aperture, coolant flow can be established between said plate chambers and said conduit; and sealant means provided around areas where said apertures are lined up with one another as to prevent coolant leakage.

4. The apparatus of claim 2, wherein said cold plates house a coolant independently and said chamber is sealed along all edges, after said coolant is provided to prevent coolant leakage and thus creating a closed plate chamber environment.

5. The apparatus of claim 1, further comprising securing means for attaching said plates to said cooling conduit more securely after said conduit is passed through said plate holes.

6. The apparatus of claim 1, wherein said cooling conduit is soldered to said plates after said conduit is passed through said holes.

7. The apparatus of claim 1, wherein said electronic device houses a plurality of components further comprising component securing means for connecting said plates to said components as to provide better concentrated cooling for said components.

8. The apparatus of claim 7, wherein components are modules.

9. The apparatus of claim 8, wherein said component securing means is a clamping mechanism.

10. The apparatus of claim 9, wherein said clamping mechanism further comprise a spring clip.

11. The apparatus of claim 7, comprising a thin layer of thermal grease applied between said modules and said plates.

12. The apparatus of claim 1, wherein said cooling conduit is serpentine in shape.

13. The apparatus of claim 1, wherein said cooling conduit and said plates are made of copper.

14. The apparatus of claim 12, wherein said cooling conduit is made of aluminum.

15. The apparatus of claim 1, wherein said conduit contains water.

16. The apparatus of claim 1, wherein said cooling conduit has two ends, and said two ends are fastened to one another after said conduit is pulled through said plates.

17. The apparatus of claim 16 wherein said two ends of said conduit are fastened to one another by a connector; said connector allowing for coolant flow.

18. The apparatus of claim 16, wherein said conduit is twisted into a serpentine shape after said conduit is pulled through said plates holes but before said two ends are fastened.

19. The apparatus of claim 16, further comprising a valve provided to regulate coolant flow and coolant flow in said conduit.

20. The apparatus of claim 19, wherein said valve is connected to an auxiliary coolant supply source, said supply source providing said conduit with coolants via said valve.

21. The apparatus of claim 17, wherein said connector is connected to an auxiliary coolant supply source, said supply source providing a conduit with coolants via said valve.

22. The apparatus of claim 1, wherein said tube comprises aluminum.

23. A method for enabling cooling of an electronic device having a three-dimensionally contoured surface to be cooled, said method comprising:

providing a plurality of spaced-apart cold plates connected therebetween via a one-piece cooling conduit; and bending portions of said cooling conduit to three-dimensionally orient said cold plates to correspond and be placed in thermal communication with the three-dimensionally contoured surface of the electronic device to be cooled.

24. The method of claim 23, further comprising providing a chamber in each plate for housing a coolant.

25. The method of claim 24, providing at least one aperture in each plate chamber and corresponding apertures provided in said cooling conduit; lining said conduit apertures with said plate chamber holes, so that coolant flow can be established between said plate chambers and said conduit; and sealing areas around where said apertures are lined up with one another as to prevent coolant leakage.

26. The method of claim 24, further comprising providing a coolant independently in each of said plate chambers and sealing said chamber along all edges after said coolant is provided as to prevent coolant leakage and thus creating a closed plate chamber environment.

27. The method of claim 23, further comprising securing said plates to said cooling conduit more securely after said conduit is passed through said plate holes.

28. The method of claim 23, further comprising the step of soldering said conduit to said plates after said conduit is passed through said plate holes.

29. The method of claim 23, wherein said electronic device houses a plurality of components further comprising the step of securing said plates to said components as to provide better concentrated cooling for said components.

30. The method of claim 29, wherein components are modules.

31. The method of claim 29, wherein said components are secured to said plates by means of a clamping mechanism.

32. The method of claim 31, wherein said clamping mechanism further comprise a spring clip.

33. The method of claim 29, further comprising applying a thin layer of thermal interface between said modules and said plates.

34. The method of claim 29, further comprising applying a thin layer of thermal grease between said modules and said plates.

35. The method of claim 23, wherein said cooling conduit is serpentine in shape.

36. The method of claim 23, wherein said coolant conduit and said plates are made of copper.

37. The method of claim 36, wherein said coolant conduit is made of aluminum.

38. The apparatus of claim 23, wherein said conduit contains water.

39. The method of claim 23, wherein said cooling conduit has two ends, further comprising the step of fastening said two ends of said conduit to one another after said conduit is pulled through said plates.

40. The method of claim 39 wherein said two ends of said conduit are fastened to one another by a connector that allows for coolant flow.

41. The method of claim 39, further comprising twisting said conduit into a serpentine shape after said conduit is pulled through said plates holes but before said two ends are fastened.

42. The method of claim 39, further comprising providing a valve to regulate coolant flow.

43. The method of claim 42, further comprising connecting said valve is to a coolant supply resource, and providing said conduit with coolants from said source via said valve.

44. The method of claim 40, further comprising connecting said connector to a coolant supply source, and providing said conduit with coolants from said source via a valve.

45. The apparatus of claim 1, wherein said cooling conduit is fabricated from a metallic material having a generally constant cross-section.

46. The apparatus of claim 1, wherein said cooling conduit comprises a tube.

47. The method of claim 23, wherein said bending comprises orientating the position of said plurality of cold plates, wherein said plurality of cold plates are disposed on different non-planar surfaces of said electronic device.

48. The method of claim 23, wherein said providing a plurality of space-apart cold plates connected therebetween via a one-piece cooling conduit comprises providing a plurality of cold plates each having at least one hole extending through said plate, providing a one-piece cooling conduit, and passing said one-piece cooling conduit through said holes of said plates.

49. The method of claim 23, wherein said conduit is fabricated from a metallic material having a generally constant cross-section.

50. The method of claim 49, wherein said conduit comprise a tube.

* * * * *